Dec. 22, 1953 G. B. HERZOG 2,663,800

FREQUENCY CONTROLLED OSCILLATOR SYSTEM

Filed Nov. 15, 1952

INVENTOR.
GERALD B. HERZOG

BY Charles H. Brown

ATTORNEY

Patented Dec. 22, 1953 2,663,800

UNITED STATES PATENT OFFICE 2,663,800

FREQUENCY CONTROLLED OSCILLATOR SYSTEM

Gerald B. Herzog, New Brunswick, N. J., assignor to Radio Corporation of America, a corporation of Delaware Application November 15, 1952, Serial No. 320,715

16 Claims. (Cl. 250—36)

This invention relates to frequency controlled oscillator systems, and more particularly, to systems wherein the frequency of an oscillator is controlled in accordance with a signal applied to a control circuit including a semi-conductor device.

The present invention is useful in a variety of applications where it is desired to control the frequency of an oscillator in accordance with the value of a signal. To mention one in particular, the invention may be used in a television receiver to insure synchronism between the synchronizing pulses derived from a received television signal and the frequency of a sawtooth wave generator used in deflecting the electron beam in the picture tube.

The frequency control circuit of this invention includes a semi-conductor device of the type known as a transistor, and the controlled oscillator may also include a semi-conductor device. Transistors are generally three-electrode semiconductor devices which include a block of semiconductive material such as germanium or silicon. The three main electrodes for a transistor are the emitter, collector and base electrodes. Present transistors are of two types, i. e., the point contact type and the junction type. Point contact transistors have a base electrode in large-area, low-resistance contact with a block of semiconductive material and have emitter and collector electrodes in the form of wires in rectifying contact with the block of semi-conductive material. The semi-conductive material may be of the *n*-type having an excess of electrons or may be of the *p*-type having an excess of "holes." Junction transistors have a single crystal with one type of material in the center and the other type on both sides. The junction transistor may be of the *p—n—p* type or the *n—p—n* type. The base electrode is connected to the central material and the emitter and collector electrodes are connected to the end materials, respectively.

A *n*-type point contact transistor and a *p—n—p* junction transistor require means to bias the emitter positively relative to the base and means to bias the collector negatively relative to the base. A *p*-type point contact transistor and a *n—p—n* junction transistor require means to bias the emitter negatively relative to the base and means to bias the collector positively relative to the base.

According to the teachings of this invention, the frequency of an oscillator is controlled by a control transistor which is connected to the oscillator in such a manner as to control the frequency of the oscillator and to be biased in a proper manner by the oscillator.

It is a general object of this invention to provide an improved oscillator system, wherein the frequency of the oscillator is controlled by a control circuit having a semi-conductor device as an essential component thereof.

It is another object to provide an oscillator system including a transistor oscillator circuit and a transistor control circuit for controlling the frequency of oscillation according to the value of an applied control signal.

A feature of the invention is the arrangement whereby the impedance between two electrodes of a control transistor is coupled across a resistor in the capacitor charging or discharging circuit of an oscillator. The coupling provides the two transistor electrodes with a proper operating bias. The capacitor charging or discharging rate and the frequency of oscillation of the oscillator are controllable in accordance with the value of a control signal applied to the third transistor electrode.

In one aspect, the invention utilizes a transistor relaxation oscillator circuit the frequency of which is determined by a fixed resistor and, in parallel therewith, the emitter-to-collector impedance of a control transistor. A direct-current control signal applied to the base electrode of the control transistor determines the emitter-to-collector impedance and the total impedance of the parallel circuit. The frequency of the relaxation oscillator varies as a function of the applied control current.

In another form of the invention, the control transistor is connected so that the base-to-collector impedance thereof is in parallel with the oscillator circuit resistor and a control signal is applied to the emitter electrode.

These and other objects, aspects, features and advantages of the invention will be apparent to those skilled in the art from the following more detailed description taken in conjunction with the appended drawings, wherein.

Figures 1, 2, 3, 4, 5, 6, 7:
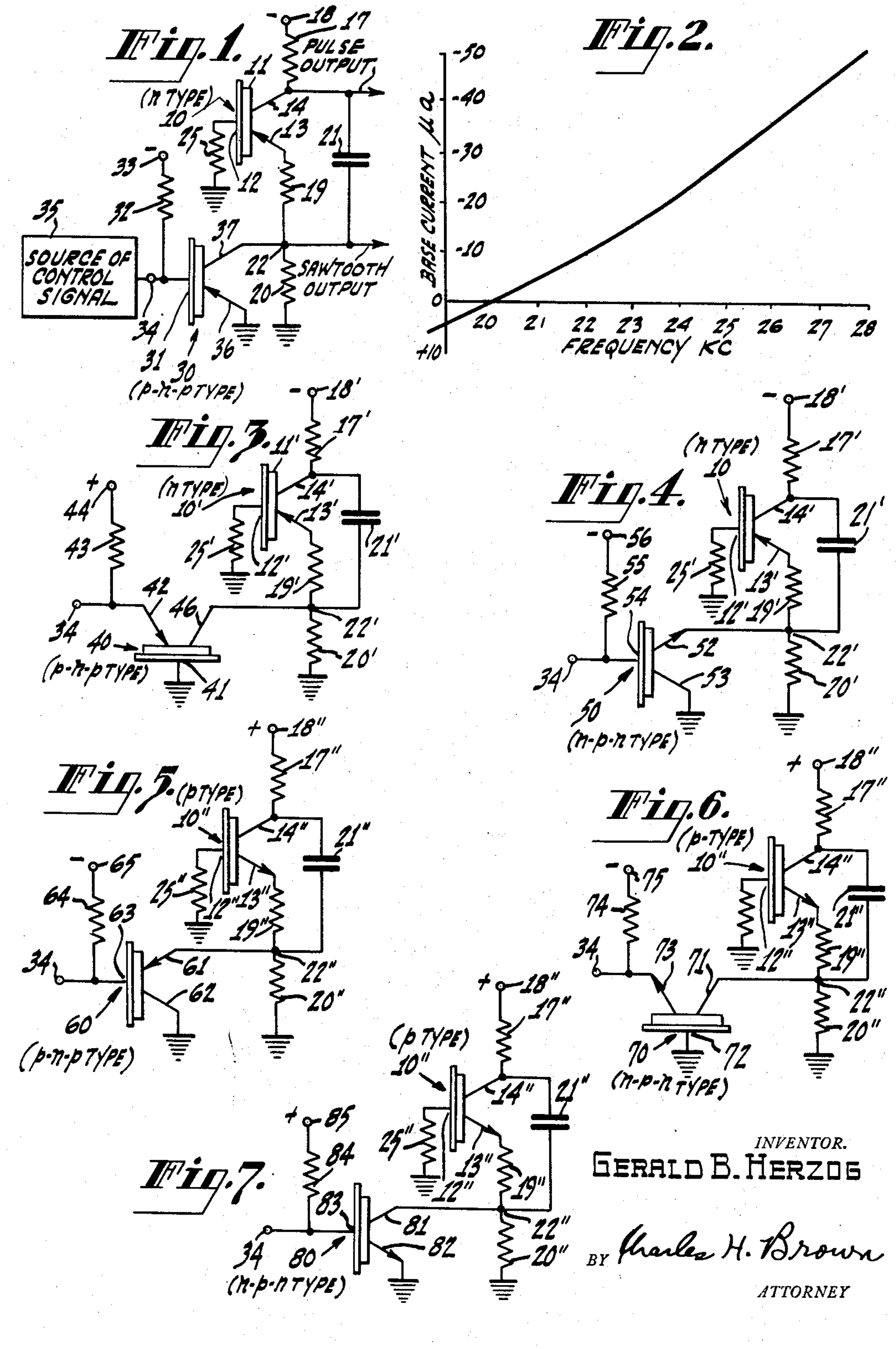
Fig. 1 is a circuit diagram of a system constructed according to the teachings of this invention for generating a sawtooth wave the frequency of which is controlled by the value of a signal applied to a control transistor.
Fig. 2 is a chart illustrating how the frequency of a specific oscillator system like that shown in Fig. 1 may vary with the input current to the control transistor.
Figs. 3 through 7 are circuit diagrams of frequency controlled oscillator systems which differ from the system shown in Fig. 1 in having different control circuits or different types of semi-conductor material in the oscillator or control transistors.

In the drawings, an emitter electrode arrow pointing into the semi-conductor body symbolizes a $n$-type point contact transistor or a $p$—$n$—$p$ junction transistor, and an emitter electrode arrow pointing away from the semi-conductor body symbolizes a $p$-type point contact transistor or a $n$—$p$—$n$ junction transistor.

Referring now to the drawings in more detail, Fig. 1 shows a sawtooth wave generator including a transistor 10. This sawtooth wave generator per se is the subject of a separate patent application Serial No. 317,854, filed October 30, 1952, by George C. Sziklai and assigned to the assignee of this application.

Sawtooth generator transistor 10 is a point contact transistor having a semi-conducting body 11 of $n$-type germanium having a small but sufficient number of donor type atomic impurities. A base electrode 12 is in low resistance contact with body 11 to determine the potential of the bulk of crystal 11. Emitter electrode 13 and collector electrode 14 are in rectifying contact with crystal 11. The collector electrode 14 is connected through a load resistor 17 to the negative terminal 18 of a source of unidirectional current (not shown), the positive terminal of the source being grounded. The emitter electrode 13 is connected through a small current limiting protective resistor 19 and another resistor 20 to ground. A storage capacitor 21 is connected between the collector electrode 14 and the junction point 22 between resistors 19 and 20. Base electrode 12 is connected through a base resistor 25 to ground. The portion of Fig. 1 which has thus far been described is a relaxation oscillator which by the proper choice of circuit elements can be made to operate as a sawtooth wave generator.

The operation of the sawtooth wave generator follows: In the circuit shown, transistor 10 is characterized in having a stable low conduction state and an unstable high conduction state. Starting with the stable condition and the storage capacitor 21 discharged, a charging current flows through resistor 20, capacitor 21 and resistor 17 to the negative terminal 18 of a battery whose positive terminal is grounded. This battery may supply a potential of 22 volts, by way of example. The charging current in passing through resistor 20 causes a voltage drop therein which biases the emitter electrode 13 negatively with respect to base 12 (in the reverse direction), thereby maintaining transistor 10 in a low conduction state. As storage capacitor 21 charges up, the charging current through resistor 20 decreases thus causing emitter electrode 13 to become more positive than it was initially. At the same time, the voltage drop across resistor 17 decreases and causes the collector electrode 14 to become more negative than it was initially. As the bias on transistor 10 is thus changed, a point is reached at which the stable low conduction state shifts suddenly to the high conduction state. Storage capacitor 21 then quickly discharges through a circuit including resistor 19, emitter electrode 13, germanium block 11, and collector electrode 14. The transistor then shifts from its unstable high conduction state to its initial stable low conduction state and the process repeats. The period of time which the transistor remains in the stable low conduction state depends on the transistor characteristics and the time constant of the charging circuit of capacitor 21.

The frequency of oscillation of the sawtooth wave generator is controllable by means of a control circuit including a transistor 30 which may be a $p$—$n$—$p$ junction transistor RCA type TA-153, or an $n$-type point contact transistor. Transistor 30 has a base electrode 31 connected through a bias resistor 32 to a negative terminal 33 of a source of unidirectional current (not shown). The positive terminal of the source is connected to ground. Base electrode 31 is also connected to a terminal 34 to which a control current is applied from a source 35. Source 35 may comprise alternating current or a varying direct current. The applied current from source 35 is superimposed on the bias current for the control transistor. If the current from source 35 is alternating, the frequency of said alternating current should be much less than, for example, one-third, the output frequency from the oscillator. In one application, the source 35 was a correcting direct current applied to control transistor 30 to restore the oscillator frequency to a predetermined value in response to variations in the oscillator frequency via circuitry not shown. An emitter electrode 36 is connected to ground and a collector electrode 37 is connected to point 22 at the junction of resistors 19 and 20 and the connection to condenser 21 of the sawtooth wave generator.

In the operation of the frequency controlled oscillator system, the emitter-to-collector impedance of control transistor 30 is in parallel with the emitter resistor 20 of the oscillator transistor 10, and the parallel combination is in the charging circuit of capacitor 21. The emitter-to-collector impedance of control transistor 30 varies with the value of control current applied by source 35 to terminal 34 and base electrode 31. As the emitter-to-collector impedance varies, the impedance of the parallel combination including resistor 20 varies and the frequency of oscillation of the system is thus a function of the control current applied to terminal 34.

The proper operation of a semi-conductor device depends upon the magnitude and polarity of the bias currents applied to the emitter, collector and base electrodes. The emitter and base electrodes should be biased in the forward direction, i. e., with polarities to induce bias current flow through the device in the relatively conductive direction. The collector and base electrodes should be biased in the reverse direction, i. e., with polarities to induce bias current flow through the device in the relatively non-conductive direction. When the semi-conductor body of control transistor 30 is of the $n$-type having impurity centers or lattice defects which provide an excess of electrons, the emitter electrode should be biased positively relative to the base electrode, and the collector electrode should be biased negatively relative to the base electrode. This bias condition exists in the system of Fig. 1 since the emitter electrode 36 is grounded and the base electrode 31 is connected through bias resistor 32 to a negative terminal 33 of a bias source. Collector electrode 37 is biased more negative than base electrode 31 by a connection to point 22. Point 22 is at a negative potential by reason of being connected through resistor 19, transistor 10 and load resistor 17 to the negative terminal 18 of a source of unidirectional potential. There is a co-operation between the transistor oscillator circuit and the transistor control circuit which provides an appropriate bias on the emitter and collector electrodes of the control transistor.

By way of example only, a system as shown in Fig. 1 was constructed which exhibited the relationship between current in base electrode 31 of control transistor 30 and output sawtooth wave frequency, which is shown in the chart of Fig. 2. It should be noted from the chart of Fig. 2 that the output sawtooth wave frequency covers a range of 20 kilocycles to 28 kilocycles. The circuit elements of the system providing this relationship were as follows:

| | | |
|---|---|---|
| Transistor 10 | point contact, RCA type TA-165 | |
| Transistor 30 | $p—n—p$ junction, RCA type TA-153 | |
| Resistor 17 | ohms | 150 |
| Resistor 19 | do | 470 |
| Resistor 20 | do | 2500 |
| Resistor 25 | do | 500 |
| Resistor 32 | megohms | 6.2 |
| Capacitor 21 | microfarads | 0.01 |

A sawtooth output wave was available at point 22 and a pulse output wave was available at the collector electrode 14 of oscillator transistor 10.

Other forms of the invention are shown in Figs. 3 and 4 wherein the sawtooth wave generator is the same as that shown in Fig. 1 and corresponding elements bear the same reference numerals with prime designations added. The transistor control circuits in Figs. 3 and 4, however, differ from that shown in Fig. 1.

Referring to Fig. 3, transistor 40, which may be a $p—n—p$ junction transistor RCA type TA-153, has a base electrode 41 connected directly to ground, a collector electrode 46 connected to point 22', and an emitter electrode 42 connected through a bias resistor 43 to a positive terminal 44 of a source of unidirectional current (not shown). The negative terminal of the source is connected to ground. Emitter electrode 42 is also connected to a terminal 34 at which a control current is applied.

In the transistor control circuit included in Fig. 3, the proper bias conditions previously mentioned are maintained. That is, the emitter electrode 42 is biased positively relative to the base electrode 41, and the collector electrode 46 is biased negatively relative to the base electrode 41. It will be noted that in Fig. 3, a positive potential is applied from a source to terminal 44, and that in Fig. 1, a negative potential is applied to the corresponding terminal 33. In Figs. 1 and 3, the control transistors 30 and 40, are $n$-type point contact transistors or $p—n—p$ junction transistors.

Fig. 4 shows another form of the invention wherein the oscillator circuit is the same as that in Figs. 1 and 3 but the control transistor 50 is a $p$-type point contact transistor or a $n—p—n$ junction transistor, as indicated by the emitter electrode 52 having an arrowhead pointing away from the body of the transistor. The collector electrode 53 is connected to ground which is positive relative to the base electrode 54. The base electrode 54 is connected through a bias resistor 55 to a negative terminal 56 of a source of unidirectional current (not shown), the positive terminal of the source being connected to ground. Base electrode 54 is also connected to the terminal 34 at which a control current is applied. The $p$-type point contact transistor or $n—p—n$ junction transistor 50 requires biases on the respective electrodes of relative polarities which are the reverse of that required for the $n$-type point contact transistors or $p—n—p$ junction transistors 30 and 40 used in the systems of Figs. 1 and 3, respectively. The proper relative polarities are provided in the system shown in Fig. 4.

Figs. 5, 6 and 7 show further variations of the invention wherein the oscillator transistor 10'' is a $p$-type point contact transistor. This is indicated in the drawings by the emitter electrodes 13'' having arrowheads pointing away from the body of the transistors 10''. Proper bias polarities are provided for transistors 10'' by applying a positive potential from a unidirectional bias source to terminals 18''. In other respects the oscillator circuits of Figs. 5, 6 and 7 are the same as those of Figs. 1, 3 and 4, and similar elements bear the same reference numerals with double prime designations added.

Referring to Fig. 5, the control transistor 60 is a $n$-type point contact transistor or a $p—n—p$ junction transistor. The emitter electrode 61 is connected to point 22'', the collector electrode 62 is grounded, and the base electrode 63 is connected through bias resistor 64 to a negative terminal 65 of a source of unidirectional current (not shown), the positive terminal of the source being grounded. The base electrode 63 is also connected to a terminal 34 for the application of a control current. The arrangement is such as to provide the proper biases on the electrodes of the control transistor 60.

Fig. 6 shows a similar system wherein the control transistor 70 is a $p$-type point contact transistor or a $n—p—n$ junction transistor. Collector electrode 71 is connected to point 22'', base electrode 72 is grounded and emitter electrode 73 is connected through a bias resistor 74 to a negative terminal 75 of a source of unidirectional potential. Emitter electrode 73 is also connected to terminal 34 to which control current is applied. The relative bias potentials on the electrodes of transistor 70 are the reverse of the potentials on the electrodes of transistor 60 in Fig. 5.

In Fig. 7, the control transistor 80 is the same type as transistor 70 of Fig. 6. However, the collector electrode 81 is connected to point 22'', the emitter electrode is grounded and the base electrode 83 is connected through a bias resistor 84 to a positive terminal 85 of a source of unidirectional potential. Base electrode 83 is also connected to terminal 34 to which control current is applied. The polarity of the bias potential at point 85 is positive and the transistor electrode connections differ from that shown in Fig. 6 to provide the proper bias relationships on the transistor 80 of Fig. 7.

In all the variations of the invention shown in Figs. 1, 3, 4, 5, 6 and 7, there is a transistor oscillator wherein the impedance from point 22, 22' or 22'' to ground determines the frequency of oscillation. There is also a control transistor having emitter and base electrodes biased in the forward direction and having collector and base electrodes biased in the reverse direction. The control transistor has one electrode connected to point 22, 22' or 22'' and another electrode connected to ground. The impedance between these two electrodes is controlled by the value of control current applied from a terminal 34 to a third electrode. The impedance between point 22, 22' or 22'' and ground, and the frequency of oscillation of the oscillator, are thus determined by the value of the control current applied to terminal 34.

What is claimed is:

1. A frequency controlled oscillator system comprising, an oscillator including a frequency determining capacitor, a charging and discharging circuit for said capacitor, an impedance element in said circuit, a semi-conductor control device including three electrodes, means connecting one of said electrodes to a point on said impedance element and a second one of said electrodes to another point on said impedance element, and means to apply a control current to the third electrode.

2. An oscillator system comprising a semi-conductor oscillator circuit including a frequency-determining resistor, a semi-conductor control device including three electrodes, means coupling two of said electrodes across said frequency-determining resistor, and means for applying a current to the third of said electrodes to control the frequency of said oscillator circuit.

3. A frequency controlled oscillator system comprising, a semi-conductor oscillator including a frequency-determining impedance element, a semi-conductor control device including three electrodes, means coupling two of said electrodes of the semi-conductor device across said frequency-determining impedance element so that the impedance between the electrodes and the impedance of said element are in parallel, and means to apply a current to the third of said electrodes to control the impedance between said two electrodes of said semi-conductor device.

4. A frequency controlled sawtooth wave generator comprising, a wave generator transistor including collector and emitter electrodes, a capacitor coupled between said collector and emitter electrodes, a collector impedance, an emitter impedance, a source of bias potential having one terminal connected to said collector impedance and the other terminal connected to said emitter impedance, a control transistor having two electrodes between which the transistor impedance varies as a function of the current applied to a third electrode, and means connecting said two electrodes of said control transistor to opposite terminals of said emitter impedance.

5. A frequency controlled sawtooth wave generator comprising, a wave generator semi-conductor device including collector and emitter electrodes, a capacitor coupled between said electrodes, a capacitor charging circuit including a source of potential and a resistor, a semi-conductor device having two electrodes across which the impedance is a function of the current applied to a third electrode, and means connecting said two electrodes respectively to terminals of said resistor.

6. A frequency controlled oscillator system comprising, a transistor oscillator circuit including a resistor the value of which affects the frequency of oscillation, a control transistor including emitter, collector and base electrodes, means connecting two of said electrodes across said resistor, and means to apply a control current to the third of said electrodes.

7. A frequency controlled oscillator system as defined in claim 6 wherein the two electrodes connected across said resistor are said emitter and collector electrodes.

8. A frequency controlled oscillator system as defined in claim 7 wherein said oscillator transistor is a $n$-type point contact transistor and said control transistor is a $p$—$n$—$p$ junction transistor.

9. A frequency controlled oscillator system as defined in claim 7 wherein said oscillator transistor is a $n$-type point contact transistor and said control transistor is a $n$—$p$—$n$ junction transistor.

10. A frequency controlled oscillator as defined in claim 7 wherein said oscillator transistor is a $p$-type point contact transistor and said control transistor is a $p$—$n$—$p$ junction transistor.

11. A frequency controlled oscillator as defined in claim 7 wherein said oscillator transistor is a $p$-type point contact transistor and said control transistor is a $n$—$p$—$n$ junction transistor.

12. A frequency controlled oscillator system as defined in claim 6 wherein the two electrodes connected across said resistor are said collector and base electrodes.

13. A frequency controlled oscillator system as defined in claim 12 wherein said oscillator transistor is a $n$-type point contact transistor and said control transistor is a $p$—$n$—$p$ junction transistor.

14. A frequency controlled oscillator system as defined in claim 12 wherein said oscillator transistor is a $p$-type point contact transistor and said control transistor is a $n$—$p$—$n$ junction transistor.

15. A frequency controlled oscillator system comprising, an oscillator semi-conductor device including base, emitter and collector electrodes, means to bias said base electrode, a source of bias potential, a load impedance connected between one terminal of said source and said collector electrode, a capacitor operatively connected between said collector and emitter electrodes, an emitter impedance operatively connected between said emitter electrode and the other terminal of said source, a semi-conductor control device including base, emitter and collector electrodes, means connecting two of said electrodes across said emitter impedance, and means to apply a control current to the other of said electrodes.

16. A frequency controlled oscillator system comprising an oscillator transistor including base, emitter and collector electrodes, a source of unidirectional potential, a load resistor connected between the negative terminal of said source and said collector electrode, a capacitor operatively connected between said collector and emitter electrodes, an emitter resistor operatively connected between said emitter electrode and the positive terminal of said source, a control transistor including base, emitter and collector electrodes, said emitter electrode being connected to the positive end of said emitter resistor and said collector electrode being connected to the opposite end of said emitter resistor, and means to apply a control current to said base electrode.

GERALD B. HERZOG.

No references cited.